United States Patent
Daanen et al.

(10) Patent No.: US 10,712,772 B2
(45) Date of Patent: Jul. 14, 2020

(54) DATA PROCESSING CIRCUITS

(71) Applicant: NXP B.V., Eindhoven (NL)

(72) Inventors: Antonius Martinus Jacobus Daanen, Beuningen (NL); Guillaume Lemaitre, Blainville sur Orne (FR); William Gerard Leijenaar, Tegelen (NL); Michael Levi, Beuningen (NL)

(73) Assignee: NXP B.V., Eindhoven (NL)

( * ) Notice: Subject to any disclaimer, the term of this patent is extended or adjusted under 35 U.S.C. 154(b) by 191 days.

(21) Appl. No.: 15/935,109

(22) Filed: Mar. 26, 2018

(65) Prior Publication Data

US 2018/0284836 A1   Oct. 4, 2018

(30) Foreign Application Priority Data

Apr. 3, 2017 (EP) .................................... 17305395

(51) Int. Cl.

| | | |
|---|---|---|
| *H03K 17/16* | (2006.01) | |
| *H03K 19/003* | (2006.01) | |
| *G06F 1/12* | (2006.01) | |
| *G06F 1/08* | (2006.01) | |
| *H03K 5/12* | (2006.01) | |
| *G06F 13/40* | (2006.01) | |

(52) U.S. Cl.
CPC ................. *G06F 1/12* (2013.01); *G06F 1/08* (2013.01); *H03K 5/12* (2013.01); *H03K 19/00323* (2013.01); *G06F 13/4068* (2013.01)

(58) Field of Classification Search
None
See application file for complete search history.

(56) References Cited

U.S. PATENT DOCUMENTS

| | | | |
|---|---|---|---|
| 5,285,116 A * | 2/1994 | Thaik | ................... H03K 17/164 326/21 |
| 6,549,036 B1 | 4/2003 | Lee | |
| 7,202,702 B2 * | 4/2007 | Arnold | ............. H03K 19/00384 326/83 |
| 2002/0087924 A1 | 7/2002 | Panis et al. | |
| 2013/0027092 A1 | 1/2013 | Bien | |

(Continued)

FOREIGN PATENT DOCUMENTS

EP     0 611 053 B1    9/2002

*Primary Examiner* — Anh Q Tran

(57) ABSTRACT

A data-processing-circuit comprising: a clock-input-terminal configured to receive a clock-signal; a data-output-terminal configured to provide a data-output-signal; an adjustable-driver-buffer configured to: receive a data-signal; and apply a driver-strength-value to the data-signal in order to provide a data-output-signal, wherein the current level of the data-output-signal is based on the driver-strength-value; and a driver-control-module comprising: a time-alignment-module configured to: process the clock-signal and the data-output-signal in order to determine a timing-delay-signal that is representative of a time delay between: a transition in the clock-signal; and a transition in the data-output-signal; provide the driver-strength-value for the adjustable-driver-buffer based on the timing-delay-signal and a target-delay-signal, wherein the driver-strength-value is for reducing a difference between: the timing-delay-signal; and the target-delay-signal.

17 Claims, 2 Drawing Sheets

(56) References Cited

U.S. PATENT DOCUMENTS

2015/0063594 A1* 3/2015 Nielsen .................. H04R 3/00
381/98
2016/0080007 A1   3/2016 Yong et al.

* cited by examiner

DATA PROCESSING CIRCUITS

CROSS-REFERENCE TO RELATED APPLICATIONS

This application claims the priority under 35 U.S.C. § 119 of European patent application no. 17305395.0, filed Apr. 3, 2017 the contents of which are incorporated by reference herein.

The present disclosure relates to data-processing-circuits, and in particular, although not exclusively, to MIPI-data-processing-circuits that can set a driver-strength of an adjustable-driver-buffer.

According to a first aspect of the present disclosure there is provided a data-processing-circuit comprising:

a clock-input-terminal configured to receive a clock-signal;

a data-output-terminal configured to provide a data-output-signal;

an adjustable-driver-buffer configured to:

receive a data-signal; and apply a driver-strength-value to the data-signal in order to provide a data-output-signal, wherein the current level of the data-output-signal is based on the driver-strength-value; and a driver-control-module comprising:

a time-alignment-module configured to:

process the clock-signal and the data-output-signal in order to determine a timing-delay-signal that is representative of a time delay between: (i) a transition in the clock-signal; and (ii) a transition in the data-output-signal; and provide the driver-strength-value for the adjustable-driver-buffer based on the timing-delay-signal and a target-delay-signal, wherein the driver-strength-value is for reducing a difference between: (i) the timing-delay-signal; and (ii) the target-delay-signal.

In one or more embodiments, the time-alignment-module further comprises a logic-block configured to provide the driver-strength-value based on: (i) the timing-delay-signal, (ii) the target-delay-signal, and (iii) a current-driver-strength-value that is representative of an in-use value for the driver-strength-value.

In one or more embodiments, the logic-block is configured to provide the driver-strength-value such that a difference between (i) the driver-strength-value; and (ii) the current-driver-strength-value is within a predetermined range.

In one or more embodiments, the time-alignment-module is configured to provide the driver-strength-value such that it is within a predetermined range.

In one or more embodiments, the time-alignment-module is configured to determine the driver-strength-value as a minimal value that results in the difference between (i) the timing-delay-signal; and (ii) the target-delay-signal, being less than a difference-threshold-value.

In one or more embodiments, the time-alignment-module is configured to start with a minimum value for the driver-strength-value.

In one or more embodiments, the driver-control-module further comprises: a feedback-buffer that is configured to apply a voltage-threshold-level to the data-output-signal in order to provide a feedback-data-signal that is representative of transitions in the data-output-signal. The time-alignment-module may be configured to process the clock-signal and the feedback-data-signal in order to determine the timing-delay-signal.

In one or more embodiments, the feedback-buffer comprises a programmable feedback-buffer configured to apply a variable-voltage-threshold-level. The data-processing-circuit may further comprise a controller configured to set the variable-voltage-threshold-level.

In one or more embodiments, the time-alignment-module comprises: a plurality of time-delay-blocks. Each time-delay-block may provide an output signal that is a time-delayed version of its input signal. The input terminal of the first time-delay-block my receive a signal that is representative of a transition in the data-output-signal. The input terminal of each of the further time-delay-blocks may be connected to the output terminal of an immediately preceding time-delay-block. The output terminals of the time-delay-blocks may provide the timing-delay-signal.

In one or more embodiments, the plurality of time-delay-blocks are included as part of a feedback loop that is configured to adapt a delay-parameter of one or more of the plurality of time-delay-blocks, such that they may have a fixed relation to the clock period of the clock-signal.

In one or more embodiments, the feedback loop is implemented as a delay-locked loop, and includes a DLL-controller. The DLL-controller may be configured to process: (i) the output signal from the last time-delay-block, (ii) the clock-signal, and (iii) the data-output-signal, in order to adapt the delay-parameter of the of one or more of the plurality of time-delay-blocks.

In one or more embodiments, the time-alignment-module is configured to: selectively provide the driver-strength-value based on a state of an enable-signal, which is representative of whether or not the driver-strength-value is to be updated.

In one or more embodiments, the time-alignment-module further comprises an output-multiplexer. The output-multiplexer may have: a first-MUX-input-terminal; a second-MUX-input-terminal; and a MUX-output-terminal. The driver-strength-value may be configured to be provided to the first-MUX-input-terminal. A fixed-driver-strength-value may be provided to a second-MUX-input-terminal. The MUX-output-terminal may be configured to apply either: (i) the driver-strength-value; or (ii) the fixed-driver-strength-value to the adjustable-driver-buffer based on the state of an enable-signal. The enable-signal may be representative of whether or not the driver-strength-value is to be updated based on the timing-delay-signal.

In one or more embodiments, the target-delay-signal is representative of a target time delay between: (i) a transition in the clock-signal; and (ii) a transition in the data-output-signal.

In one or more embodiments, the data-processing-circuit is a MIPI-data-processing-circuit.

There may also be provided a method of data-processing, the method comprising:

an adjustable-driver-buffer applying a driver-strength-value to a data-signal in order to provide a data-output-signal, wherein the current level of the data-output-signal is based on the driver-strength-value;

processing a clock-signal and the data-output-signal in order to determine a timing-delay-signal that is representative of a time delay between: (i) a transition in the clock-signal; and (ii) a transition in the data-output-signal;

providing the driver-strength-value for the adjustable-driver-buffer based on the timing-delay-signal and a target-delay-signal, wherein the driver-strength-value is for reducing a difference between: (i) the timing-delay-signal; and (ii) the target-delay-signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

BRIEF DESCRIPTION OF DRAWINGS

FIG. 1 shows an example embodiment of a data-processing-circuit, which in this example is a MIPI-data-processing-circuit 100. The MIPI-data-processing-circuit 100 includes a clock-input-terminal 102, a data-output-terminal 104, an adjustable-driver-buffer (SDATA buffer) 106, and a MIPI-digital-logic-circuit 108. The clock-input-terminal 102 receives a clock-signal (SCLK) 114, which can be used as a clock signal by the MIPI-digital-logic-circuit 108. The MIPI-digital-logic-circuit 108 provides a data-signal (sdata signal) 110 to the adjustable-driver-buffer 106. The adjustable-driver-buffer 106 provides a data-output-signal (SDATA) 112 based on the data-signal 110. The adjustable-driver-buffer 106 applies a driver-strength to the data-signal (sdata signal) 110, such that the current level of the data-output-signal (SDATA) 112 (for a given load) is set based on the value of the driver-strength.

The data-output-terminal 104 provides the data-output-signal 112 as an output signal of the MIPI-data-processing-circuit 100. In this example, the MIPI-data-processing-circuit 100 is a slave module, the clock-signal (SCLK) 114 is received from a MIPI master SCLK output, and the data-output-signal (SDATA) 112 is provided to a MIPI master SDATA input.

Figure 1:
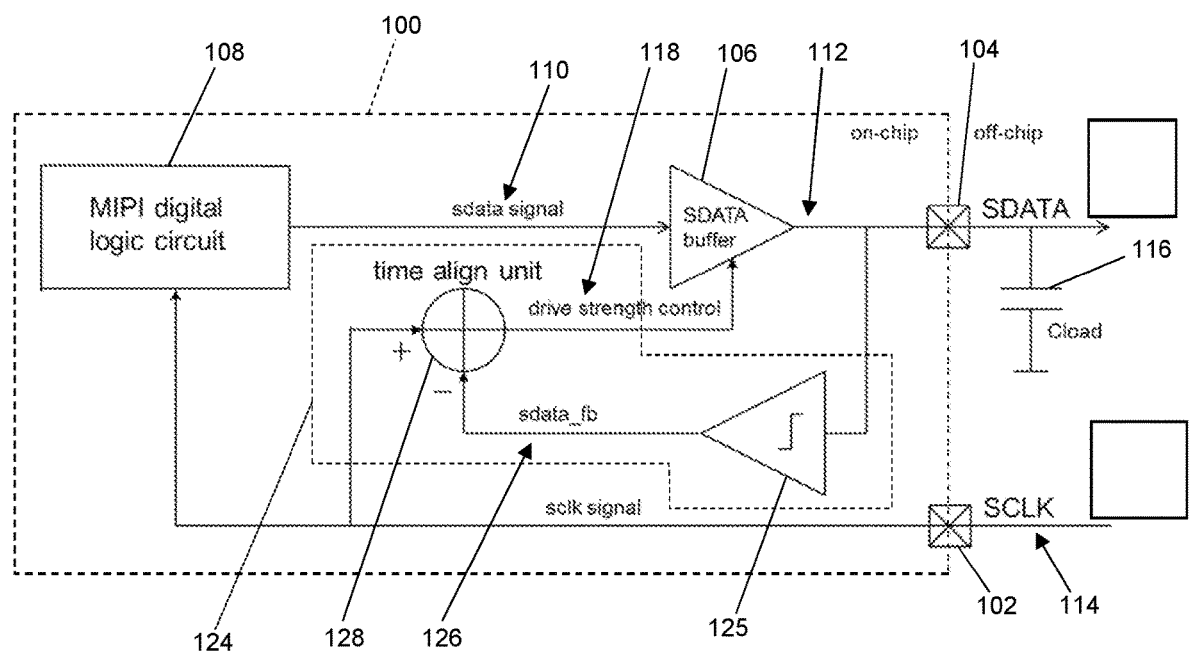
FIG. 1 shows an example embodiment of a data-processing-circuit.

Also shown in FIG. 1 is a load-capacitance (Cload) 116 that is connected between the data-output-terminal 104 and a reference terminal, such as a ground terminal. The load-capacitance (Cload) 116 can be referred to as an SDATA bus load capacitance, and is representative of the total unavoidable parasitic capacitance of bus wiring, including terminal capacitance of master and/or slave devices connected to the bus.

MIPI is a standard defined by the MIPI Alliance, Inc., and is described in "Specification for RF Front-End Control Interface (RFFE)", Version 2.0, 25 Sep. 2014. It serves as a control interface between a host controller (master) and one or more controlled devices (slaves). The standard describes details about protocol, voltage and current characteristics (levels, timing) on the SDATA and SCLK pins.

The standard also describes a programmable driver-strength of the adjustable-driver-buffer 106 for a given SDATA bus load capacitance (Cload 116). A register space BUS_LD can be defined in the slave in which the driver-strength, for an expected capacitive load Cload is pre-programmed, based on a once-determined system with combined master and (multiple) slave(s) operation. The MIPI standard does not define a method of how to control the driver-strength of the adjustable-driver-buffer 106. That is, it does not define what information is used to establish the intended driver-strength. This can lead to non-operation (in case the driver-strength is too low, causing failing data transfer), or sub-optimal operation (in case the driver strength is too high, causing increased EMI).

Variables in a MIPI system that can influence the SDATA signal timing are: (i) IC manufacturing process spread, and supply voltage and temperature sensitivity of the driver-strength of the adjustable-driver-buffer 106; and (ii) uncertainty about the SDATA line load capacitance (Cload 116) in a given application, or even multiple applications in which a slave device is instantiated.

If the driver-strength of the adjustable-driver-buffer 106 for each device in the system is once-determined by evaluation, it is programmed as a fixed value in the register space of the devices (BUS_LD). The device will then use this fixed value throughout operation.

As indicated above, device characteristics may spread with different environmental conditions, such as supply voltage and temperature. Also, the individual processing characteristics of each single device can show a certain spread, leading to additional device characteristics spread. Therefore, the fixed register setting (determined from the outcome of an initial, single, evaluation) should be set at a value that results in the desired operation for all expected deviations in the device characteristics. However, this fixed register setting may not be able to adequately account for unforeseen variations in the SDATA line load capacitance (Cload 116), which depend on the application.

It can be advantageous, in a communication system as described by MIPI, for the driver-strength of the adjustable-driver-buffer 106 to be not more than actually necessary for timing purposes, in the given environmental conditions. In this way, the EMI (Electromagnetic Interference) is lowest and signal ringing, which can distort the signal communication itself, will be minimized. However, with a fixed driver-strength setting, the driver-strength will often be too high, since it has to be able to accommodate variations in the device characteristics. Therefore, use of a fixed driver-strength setting can cause unnecessarily high EMI and signal ringing.

The adjustable-driver-buffer 106 in this example is a CMOS output driver, which is well known to a person skilled in the art. The driver-strength of the adjustable-driver-buffer 106 can be increased by activating/using extra output transistors in parallel with already active/present output transistors, and controlling the gate signal of the extra output transistors with the same gate signal as that used for the already active output transistors. Similarly, the driver-strength of the adjustable-driver-buffer 106 can be decreased by disabling the gate signal of active transistors such that those transistors do not contribute to the output current of the adjustable-driver-buffer 106. The number of output transistor units for which the gate signal can be separately enabled and disabled determines the range of driver-strength values that can be provided by the adjustable-driver-buffer 106. The number of output transistor units can be chosen to fit required MIPI communication channel characteristic requirements, such as minimum and maximum SDATA clock to data delay, and minimum and maximum capacitive load Cload 116 on the data-output-terminal 104. The driver-strength of the adjustable-driver-buffer 106 can be set in accordance with a control signal (in this example referred to as a drive-strength-signal 118) that consists of a limited number of single digital bits one for each of the available transistor units.

The driver-strength of the adjustable-driver-buffer 106 can be considered as controlling a current level that is made available at the output terminal of the adjustable-driver-buffer 106 to charge and discharge the load-capacitance Cload 116. A lower driver-strength will cause a gentle slope in the voltage level of the data-output-signal (SDATA) 112 at the data-output-terminal 104. Whereas a higher driver-strength will cause a steep slope in the voltage level of the data-output-signal (SDATA) 112. The receiving end of a line that is connected to the data-output-terminal 104 (SDATA input of MIPI master) can have an input buffer with a certain voltage threshold level, below which the SDATA voltage is interpreted as being a digital low signal, and above which the SDATA voltage is interpreted as being a digital high signal. Thus, a varying slope of the rising and falling edge of the voltage level of the data-output-signal (SDATA) 112 can be considered as corresponding to a varying time delay from SCLK to "sdata after input buffer" signal edge, when the receiving end interprets the SDATA signal as changing from high to low or vice versa.

Figure 2:
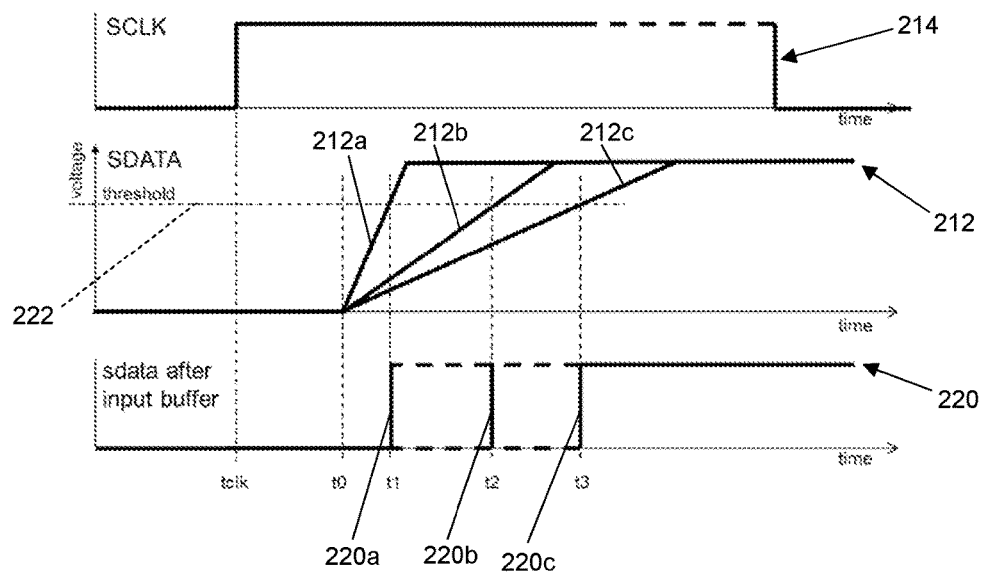
FIG. 2 shows graphically how the driver-strength of the adjustable-driver-buffer affects a time delay in a signal transition.

FIG. 2 shows graphically how the driver-strength of the adjustable-driver-buffer affects a time delay in a low-to-high transition that is detected by an input buffer of a circuit that receives the data-output-signal 212.

FIG. 2 shows three plots:

a clock-signal (SCLK) 214, which is received by the MIPI-data-processing-circuit of FIG. 1, and also received by the circuit that receives the data-output-signal 212;

three variations of a data-output-signal (SDATA) 212 that can be provided by the MIPI-data-processing-circuit; and three variations of a "sdata after input buffer" signal, which can be considered as a received-processed-data-signal 220 because it represents the output-signal of an input-buffer of the circuit that receives the data-output-signal 212. The logic level of the received-processed-data-signal 220 is set based on a comparison between: (i) the received data-output-signal (SDATA) 212; and (ii) a voltage-threshold-level 222. If the voltage level of SDATA 212 is below the voltage-threshold-level 222, then the voltage level of SDATA 212 is interpreted as being a digital low signal, and therefore the received-processed-data-signal 220 has a logic low level. If the voltage level of SDATA 212 is above the voltage-threshold-level 222, then the voltage level of SDATA 212 is interpreted as being a digital high signal, and therefore the received-processed-data-signal 220 has a logic high level.

Three variations of the data-output-signal (SDATA) 212 are shown in FIG. 2: a fast-data-output-signal 212a; a medium-data-output-signal 212b; and a slow-data-output-signal 212c. The fast-data-output-signal 212a is generated by an adjustable-driver-buffer with a high driver-strength value. The medium-data-output-signal 212b is generated by an adjustable-driver-buffer with a medium-driver-strength value. The slow-data-output-signal 212c is generated by an adjustable-driver-buffer with a low driver-strength value.

The third plot of FIG. 2 shows the three corresponding received-processed-data-signals 220a, 220b, 220c for the three variations of the data-output-signal (SDATA) 212. As can be seen, the variation in the slope of the data-output-signal (SDATA) 212 affects the time delay between: (i) a rising edge in the clock-signal 214 (tclk); and (ii) a rising edge in the received-processed-data-signals 220a, 220b, 220c (t1, t2, t3). The three values of the time delay (TPD) are indicated in FIG. 2 as:

a short time delay (t1-tclk) for the fast-data-output-signal 212a;

a medium time delay (t2-tclk) for the medium-data-output-signal 212b; and a long time delay (t3-tclk) for the slow-data-output-signal 212c.

Therefore, it is clear from FIG. 2 that increasing the driver-strength of the adjustable-driver-buffer decreases the time delay (TPD) between: (i) an edge in the clock-signal 214; and (ii) a corresponding edge in the received-processed-data-signals 220a, 220b, 220c, and vice versa.

Returning to FIG. 1, the MIPI-data-processing-circuit 100 also includes a driver-control-module 124. The driver-control-module 124 processes the clock-signal 114 and the data-output-signal in order to determine a timing-delay-signal (not shown in FIG. 1) that is representative of a time delay between: (i) a transition in the clock-signal; and (ii) a transition in the data-output-signal. This time delay can also be referred to as TPD, as discussed above, with reference to FIG. 2.

The driver-control-module 124 can then determine a driver-strength-value 118, for setting the driver-strength of the adjustable-driver-buffer 106, based on the timing-delay-signal and a target-delay-signal (not shown in FIG. 1). The target-delay-signal can be representative of a desired time delay between a transition in clock-signal 114 and a transition in the data-output-signal (SDATA) 112, for example a time delay that is suitable for the circuit that receives the data-output-signal (SDATA) 112 from the MIPI-data-processing-circuit 100. The driver-control-module 124 can determine the driver-strength-value 118 such that it is for reducing a difference between: (i) the timing-delay-signal; and (ii) the target-delay-signal. Further details of an implementation of the driver-control-module 124 will be provided below with reference to FIG. 3.

In the example of FIG. 1, the driver-control-module 124 includes a feedback-buffer 125. The feedback-buffer 125 receives the data-output-signal (SDATA) 112 as an input signal, and provides a feedback-data-signal (sdata_fb) 126 as an output signal. The feedback-buffer 125 is intended to be similar to an input-buffer of the circuit that will receive the data-output-signal (SDATA) 112. Therefore, the feedback-data-signal (sdata_fb) 126 is intended to be similar to the "sdata after input buffer" signal (received-processed-data-signal) that is shown in FIG. 2. That is, the feedback-buffer is configured to apply a voltage-threshold-level to the data-output-signal (SDATA) 112, and provide the feedback-data-signal (sdata_fb) 126 as a digital signal that has a logic level based on whether or not the data-output-signal (SDATA) 112 exceeds the voltage-threshold-level. In this way, the feedback-data-signal (sdata_fb) 126 is representative of transitions in the data-output-signal.

The driver-control-module 124 also includes a time-alignment-module 128 that processes the clock-signal 114 and the feedback-data-signal (sdata_fb) 126 in order to determine a timing-delay-signal (not shown) that is representative of the time delay between: (i) a transition in the clock-signal 114; and (ii) a transition in the data-output-signal (as determined from the feedback-data-signal (sdata_fb) 126). The time-alignment-module 128 also compares the timing-delay-signal with the target-delay-signal in order to provide the driver-strength-value 118. In this way, the time-alignment-module 128 can compare the time difference between the edges of the SCLK signal 114 and the sdata_fb signal 126. The feedback-data-signal (sdata_fb) 126 is thus used in a feedback loop to control the driver-strength of the adjustable-driver-buffer 106.

In this way, the MIPI-data-processing-circuit 100 of FIG. 1 can advantageously adapt the driver-strength of the adjustable-driver-buffer 106 based on its environmental conditions (to accommodate supply voltage and temperature changes, for instance) and/or the load capacitance 116 on the SDATA bus (including the associated timing variations) and/or IC manufacturing process spread. Also, EMI and/or ringing can be reduced or minimised.

Furthermore, as will be discussed in more detail below, the driver-control-module 124 can advantageously perform evaluation work to reduce the driver-strength value, in some examples to a minimum value, whilst still ensuring that necessary timing requirements are satisfied. This can be possible because the MIPI-data-processing-circuit 100 can adapt itself to the necessary driver-strength based on monitored signal levels. This can enable the MIPI-data-processing-circuit 100 to be used efficiently in multiple environments, with varying characteristics of bus load, without a need for significant further evaluation. This adaptive driver-strength functionality can also be advantageous in test environments, where the MIPI device is to be tested for correct operation and characterisation of its timing parameters.

In some examples, for potentially better and more accurate control, the feedback-buffer 125 (which can also be referred to as a slave receiving input buffer) can be a programmable feedback-buffer that can apply a variable voltage-threshold-level. In this way, a controller (not shown) can set the variable-voltage-threshold-level such that a change in the level of the feedback-data-signal (sdata_fb) 126 is triggered by a voltage level of the data-output-signal (SDATA) 112 that provides a good match with the voltage-threshold-level of the input buffer of the master module that will receive the data-output-signal (SDATA) 112. The buffer 125 on a slave device can be the same kind of circuit type as the SDATA input buffer on the master device (e.g. CMOS logic). Therefore, once determined, there may be no need to adapt the voltage-threshold-level. Nonetheless, in some circumstances, the controller (not shown can receive information from the master about the voltage-threshold-level to be applied, and then set the variable-voltage-threshold-level accordingly.

Figure 3:
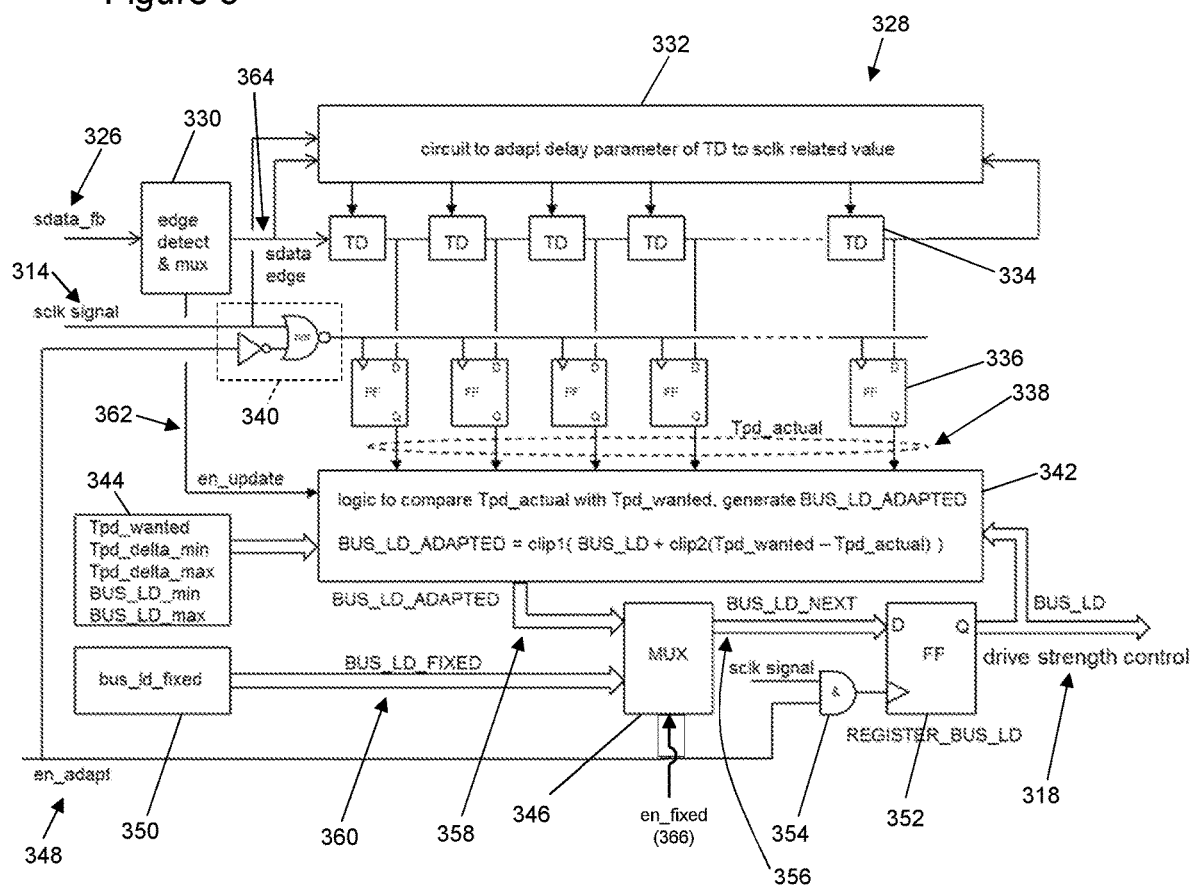
FIG. 3 shows an example embodiment of a time-alignment-module, such as the one illustrated in FIG. 1.

FIG. 3 shows an example embodiment of a time-alignment-module 328, such as the one illustrated in FIG. 1. The time-alignment-module 328 receives a feedback-data-signal (sdata_fb) 326 and a clock-signal (sclk_signal) 314 as input signals, and provides a driver-strength-value (having a value of BUS_LD) 318 as an output signal. As discussed above, the driver-strength-value 318 sets the driver-strength of an adjustable-driver-buffer.

The time-alignment-module 328 includes an optional "edge detect & mux" block 330, which can ensure that the value of BUS_LD is only adapted if there is a change in the sdata_fb signal 326. In this example, the "edge detect & mux" block 330 provides an en-update signal 362 in response to detection of an edge in the sdata_fb signal 326. The en-update signal 362 is provided as an input signal to a logic-block 342, which will be described in detail below, such that an adapted value of BUS_LD (a BUS_LD_ADAPTED signal 358) is only calculated in response to a change in the sdata_fb signal 326. Consequently, the value BUS_LD does not change if sdata_fb 326 has no level change, since a non-changing sdata_fb 326 does not contain timing information to react upon.

The "edge detect & mux" block 330 also provides an sdata_edge signal 364, which includes a transition from low to high at every level change of the sdata_fb signal 326, irrespective of whether the sdata_fb signal 326 changes from low to high, or vice versa.

The edge detect operation is used to provide the en_update signal. The edge_detect operation is also used to discriminate between rising and falling edges of sdata_fb 326, and to use this to control e.g. a mux for choosing sdata_fb, or an inverted version thereof, or none of both to provide the sdata_edge 364 output signal. In this way, a low-to-high transition of the sdata_edge signal 364 appears for rising, falling, none or each transition in the sdata_fb signal 326. This allows tailoring the operation of the delay control to the needs of an application. The sdata_edge signal 364 is provided as an input signal to a chain of unit time-delay-blocks (TD) 334. Each TD block 334 provides an output signal that is a time-delayed version of its input signal. The input terminal of the first TD block receives the sdata_edge signal 364. The input terminal of each of the further TD blocks is connected to the output terminal of an immediately preceding TD block.

The output terminals of each of the TD blocks 334 is also connected to the D-input-terminal of an associated D-type-flip-flop 336. A clock-input-terminal of each D-type-flip-flop 336 receives a D-clock-signal that is based on the clock-signal (sclk_signal) 314. In this example, the time-alignment-module 328 includes an optional timing-logic-block 340 which provides the D-clock-signal such that it has a rising edge when: (i) an en_adapt signal 348 is set; and (ii) a falling edge is present in the clock-signal (sclk_signal) 314. The en_adapt signal 348 can therefore be used to disable the D-type-flip-flops 336 if, for whatever reason, the driver-strength-value 318 is not to be updated based on the most recently received a feedback-data-signal (sdata_fb) 326.

More generally, the D-clock-signal can be set based on: (i) an en_adapt signal 348, which is representative of whether or not the driver-strength-value 318 is to be updated; and (ii) the clock-signal (sclk_signal) 314.

The D-type-flip-flops 336 can together be considered as a Tpd-actual-register, which stores as Tpd_actual 338 as the value of the timing-delay-signal that will be compared with a target-delay-signal (Tpd_wanted).

In this way, at every falling edge of the sclk_signal 314, the Tpd-actual-register (D-type flip-flops 336) samples the output of the delay chain of unit delays TD 334. The input to the delay chain is sdata_edge 364, which is derived from the actual measured data signal sdata_fb 326.

Each of the D-output-terminals of the D-type-flip-flops 336 provides a D-output-signal that has a value that corresponds to the value of the signal received at its D-input-terminal when the D-clock-signal transitions, either from high-to-low, or low-to-high, depending on choice of flip-flop implementation. The values of each of the D-output-signals can together be considered as a multi-bit parallel signal, which is identified as Tpd_actual 338 in FIG. 3. Tpd_actual 338 is a timing-delay-signal that represents the actual/measured time delay between: (i) a transition in the feedback-data-signal (sdata_fb) 326; and (ii) a transition in the clock-signal (sclk_signal) 314.

Tpd_actual 338 is provided as an input signal to the logic-block 342. The output signal of the logic-block 342 has a value of BUS_LD_ADAPTED 358, which is representative of the calculated next value for BUS_LD (the driver-strength). Also provided as input signals to the logic-block 342 are: BUS_LD, which can be considered as a current-driver-strength-value that represents an in-use value for the driver-strength-value 318; and a target-delay-signal, which is represented in FIG. 3 as Tpd_wanted in register space 344. This register space 344 includes fixed values that will be used by the logic-block 342. In this example, the fixed values include the following (although it will be appreciated that in other examples one or more of these fixed values may not be required):

Tpd_delta_min, which is representative of a minimum amount that BUS_LD (the driver-strength) can change for each cycle of the clock-signal (sclk_signal) 314. In some examples Tpd_delta_min can be a negative (non-zero) value;

Tpd_delta_max, which is representative of a maximum amount that BUS_LD (the driver-strength) can change for each cycle of the clock-signal (sclk_signal) 314. In some examples Tpd_delta_max can be a positive (non-zero) number;

BUS_LD_min, which is representative of a minimum value for BUS_LD (the driver-strength);

BUS_LD_max, which is representative of a maximum value for BUS_LD (the driver-strength).

BUS_LD_min and BUS_LD_max keep the value of BUS_LD_ADAPTED 358 (and hence BUS_LD) within a range that can correspond to an actual implementation of the SDATA buffer drive strength range for SDATA delay TPD as required by MIPI.

The logic-block 342 applies logic that compares Tpd_actual 338 with Tpd_wanted in order to generate BUS_LD_ADAPTED 358. The logic is as follows:

BUS_LD_ADAPTED=clip1(BUS_LD+clip2(Tpd_wanted−Tpd_actual))

Where:

clip1=MIN(MAX(BUS_LD_min, BUS_LD+clip2(Tpd_wanted−Tpd_actual)), BUS_LD_max)

clip2=MIN(MAX(Tpd_delta_min, Tpd_wanted−Tpd_actual), Tpd_delta_max)

The "clip1" function can keep the BUS_LD_ADAPTED value within limits that fit the actual range of variation of the bus load capacitance (Cload) and/or limits in driver-strength implementation. The "clip2" function can set the rate-of-change of BUS_LD_ADAPTED while updating BUS_LD in adaptive mode, for example 1 minimum resolution step per clock cycle. The use of clip2 can keep timing changes within defined bounds, and can result in more stable system operation. In relation to an initial situation, for example at startup, the master can have sufficient knowledge about the system such that initial reset parameters can enable correct functional operation (for example, correct data transfer, but possibly with too high EMI, or at a low clock rate).

That is, in line with the fixed values that are discussed above, BUS_LD_ADAPTED 358 is calculated based on a difference between Tpd_actual with Tpd_wanted, and such that: BUS_ LD _ADAPTED is within a predetermined range (BUS_LD_min to BUS_LD_max), and such that the difference between BUS_LD_ADAPTED and BUS_LD is within a predetermined range (Tpd_delta_min to Tpd_delta_max).

Tpd_delta_min shall be negative and Tpd_delta_max shall be positive, thus a difference of 0 stays 0 and is not change by clip2( ).

The following numerical example provides further details of how the above logic can be applied (using decimal representation for the digital values for ease of illustration). It will be appreciated that the specific numeric values are purely illustrative, and not limiting.

Tpd_actual is a thermometric code ranging from e.g. Tpd_actual_min (corresponding to a slow SDATA signal) to Tpd_actual_max (corresponding to a fast SDATA signal). For example: Tpd_actual_min=0 Tpd_actual_max=32

(Note: it will be appreciated that alternatives, using an additional delay in sdata_edge or sclk_signal, can be used to reduce/minimise the number of implemented TD and FF units, while still fitting the required range of timing.) Tpd_wanted=16 Tpd_delta_min=−1 (in this example it should be smaller than 0) Tpd_delta_max=+2 (in this example it should be larger than 0)

When Tpd_actual is 10 (e.g. too slow SDATA signal), then clip2 output will be clip2(16−10)=clip2(6)=+2

In this example, we have the following:
BUS_LD=3
BUS_LD_min=0 (weak driver-strength)
BUS_LD_max=7 (strong driver-strength)
Then clip1 output will be clip1(3+(+2))=clip1(5)=5
No BUS_LD clipping will occur this time and the step of +2 will be made.

If in the next clock cycle Tpd_actual is +12 (due to stronger drive strength), then:
clip2(16−12)=+2
clip1(5+(+2))=7

If in the next clock cycle Tpd_actual is +15 (due to even stronger drive strength), then
clip2(16−15)=+1
clip1(7+(+1))=7

The further driver-strength increase is limited by BUS_LD_max in this case

The logic also implements the way the control loop operates from a given initial delay time. The logic will start with the highest driver-strength, corresponding to BUS_LD_max, which applies the minimum possible SDATA delay time. That is, before performing a first iteration of determining the driver-strength (BUS_LD), the logic-block 342 can provide BUS_LD_max as BUS_LD_ADAPTED 358. This can guarantee correct functionality of the MIPI communication. With every sdata_edge 364, the feedback loop will update the value of BUS_LD_ADAPTED, until a state where Tpd_wanted Tpd_actual is zero and consequently EMI is reduced.

A result of the logic used in this example, is that BUS_LD_ADAPTED 358 (which will be used to set the driver-strength of the adjustable-driver-buffer) is converging towards the target value set via Tpd_wanted. In this way, the time delay (TPD) between transitions in MIPI SCLK and SDATA is set, while staying within MIPI timing requirements for the given operational MIPI operation mode and for minimized EMI. That is, the logic-block 342 can determine the driver-strength-value as a value that results in the minimised difference between (i) the timing-delay-signal (Tpd_actual); and (ii) the target-delay-signal (Tpd_wanted).

The BUS_LD_ADAPTED 358 value is provided as an input signal to a first-MUX-input-terminal of an output-multiplexer (MUX) 346. A BUS_LD_FIXED value 360 is provided to a second-MUX-input-terminal of the output-multiplexer (MUX) 346, optionally from a register space 350 as shown in FIG. 3. The output-multiplexer (MUX) 346 is controlled by the en_fixed signal 366 such that: (i) the BUS_LD_ADAPTED 358 value is provided to the MUX-output-terminal of the MUX 346 when the en_fixed signal 366 indicates that the driver-strength-value 318 is to be updated based on the received feedback-data-signal (sdata_fb) 326; or the BUS_LD_FIXED 360 value is provided to the MUX-output-terminal of the MUX 346 when the en_fixed signal 366 indicates that the driver-strengthvalue 318 is not to be updated based on the received feedback-data-signal (sdata_fb) 326. The BUS_LD_FIXED value 360 may be referred to as a fixed-driver-strength-value, that is to be applied if it is considered inappropriate to calculate BUS_LD based on the received feedback-data-signal (sdata_fb) 326. The value of the output signal of the MUX 346 is referred to as BUS_LD_NEXT 356. BUS_LD_FIXED may be a fixed default value or may be copied from an appropriate BUS_LD value at any chosen time, reflecting a given device characteristic and/or Cload condition.

BUS_LD_NEXT 356 is written into a next-driver-strength-register (REGISTER_BUS_LD) 352, which is implemented as a D-type flip flop in this example, upon a transition in the clock-signal (sclk_signal) 314. In this example, an optional logic gate 354 is used such that BUS_LD_N EXT 356 is only written into the next-driver-strength-register 352 when the en_adapt signal 348 indicates that the driver-strength-value 318 is to be updated based on the received feedback-data-signal (sdata_fb) 326. As long as the en_adapt signal 348 is not asserted, the value BUS_LD is fixed and does not change. Unless, in some examples, en_fixed 366 is asserted and BUS_LD_FIXED is changed by operation of MIPI to alter the fixed value for the driver-strength.

In this way, the time-alignment-module 328 is configured to selectively provide the driver-strength-value 318 based on a state of an enable-signal (en_adapt signal 348 and en_fixed signal 366), which are representative of whether or not the driver-strength-value 318 is to be updated.

The next-driver-strength-register (REGISTER_BUS_LD) 352 can be similar to a corresponding register that is described in the MIPI RFFE specification. This register can contain a value BUS_LD that determines the driver-strength for the SDATA buffer based on the value of the capacitive load Cload. As discussed above, when the en_fixed signal 366 is asserted, the MUX 346 passes BUS_LD_FIXED 360 to BUS_LD_NEXT 356 such that it will be stored in the register REGISTER_BUS_LD 352. When the en_adapt signal 348 is asserted, at every rising edge of the sclk signal 314, BUS_LD will be determined by BUS_LD_NEXT 356, which in turn is determined by BUS_LD_FIXED 360 (if en_fixed 366 is asserted) or BUS_LD_ADAPTED 358 (if en_fixed 366 is not asserted). This latter signal is the output of the logic-block 342 that compares the actual delay time (Tpd_actual 338) with a given wanted delay time (Tpd_wanted).

The output signal (driver-strength-value 318) of the time-alignment-module 328 is the output signal from the next-driver-strength-register (REGISTER_BUS_LD) 352.

The operation whereby the loop that is applied by the logic-block 342 is active in adapting the driver-strength (BUS_LD), while comparing the actual signal timing with the reference timing, can be at the cost of power consumption. In the general spirit of the MIPI RFFE communication standard, examples described herein can reduce/minimize the signal activity and resulting power consumption and disturbance. Therefore, the adaptive loop can have a low-power-mode in which the result of an adaption is kept for subsequent communication frames and no further adaptions are done. This low-power-mode is set when the en_adapt signal 348 is low (not asserted). This is a distinct feature of the self-adaptive SDATA buffer drive strength mechanism that can be performed by examples disclosed herein.

The time-delay-blocks (TD) 334 may be subject to IC manufacturing spread, and variations in supply voltage and temperature. Therefore, in this example, the delay chain is included as part of a feedback loop that adapts the time delays that are applied by the time-delay-blocks (TD) 334, such that they have a fixed relation to the clock period of the sclk signal 314. For example, suppose 32 instances of TD 334 are used and each unit has a delay time of about 0.9 ns by default. Also, suppose a clock frequency of 31.25 MHz is used. The TD feedback loop is then constructed such that it will tune all TD units 334 to a delay value of average 1.0 ns, such that the total delay equals one period of a clock cycle. The feedback loop also includes a DLL-controller 332, which can process the output signal from the last TD block 334, the sclk signal 314 and the sdata_edge signal 364 in order to adapt a delay-parameter of each TD block 334. Such a feedback loop can be implemented as a Delay-Locked Loop (DLL).

The DLL has a certain loop bandwidth, determining the time that is needed to settle to a stable controlled value. This loop bandwidth should be taken into account in the design choices of how the time-align-unit 328 behaves at initial startup, and also how it behaves after a change of frequency in sclk_signal 314.

One or more of the examples described herein include a SDATA buffer driver with a feedback loop, which can take into account the actual bus load on the SDATA terminal.

The SCLK signal can be used as a timing reference. Using the timing of SCLK as a reference, IC manufacturing spread and supply voltage and temperature sensitivities of the driver-strength of the SDATA buffer driver can be beneficially compensated. For the given actual environmental conditions, including Cload, the feedback loop can control the driver-strength of the SDATA buffer to the minimum necessary value to satisfy MIPI absolute timing requirements, while minimizing/reducing EMI and signal ringing.

Examples disclosed herein can be applicable to any product containing a MIPI interface. The use of MIPI is widespread in products like mobile telephones, tablets and other wireless communication devices. Example products that contain a MIPI controller are RF LNA products.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A data-processing-circuit comprising:
   a clock-input-terminal configured to receive a clock-signal;
   a data-output-terminal configured to provide a data-output-signal;
   an adjustable-driver-buffer configured to:
      receive a data-signal; and
      apply a driver-strength-value to the data-signal in order to provide a data-output-signal,
      wherein a current level of the data-output-signal is based on the driver-strength-value; and
   a driver-control-module comprising:
      a time-alignment-module configured to:
      process the clock-signal and the data-output-signal in order to determine a timing-delay-signal that is representative of a time delay between: a transition in the clock-signal; and a transition in the data-output-signal; and
      provide the driver-strength-value for the adjustable-driver-buffer based on the timing-delay-signal and a target-delay-signal,
      wherein the driver-strength-value is for reducing a difference between: the timing-delay-signal; and the target-delay-signal by varying the current level of the data-output-signal based on the driver strength-value.

2. The data-processing-circuit of claim 1,
wherein the time-alignment-module further comprises a logic-block configured to provide the driver-strength-value based on: the timing-delay-signal, the target-delay-signal, and a current-driver-strength-value that is representative of an in-use value for the driver-strength-value.

3. The data-processing-circuit of claim 2,
wherein the logic-block is configured to provide the driver-strength-value such that a difference between the driver-strength-value; and the current-driver-strength-value is within a predetermined range.

4. The data-processing-circuit of claim 1,
wherein the time-alignment-module is configured to provide the driver-strength-value such that it is within a predetermined range.

5. The data-processing-circuit of claim 1,
wherein the time-alignment-module is configured to determine the driver-strength-value as a minimal value that results in the difference between the timing-delay-signal; and the target-delay-signal, being less than a difference-threshold-value.

6. The data-processing-circuit of claim 1,
wherein the time-alignment-module is configured to start with a minimum value for the driver-strength-value.

7. The data-processing-circuit of claim 1, wherein the driver-control-module further comprises:
   a feedback-buffer that is configured to apply a voltage-threshold-level to the data-output-signal in order to provide a feedback-data-signal that is representative of transitions in the data-output-signal; and
   wherein the time-alignment-module is configured to process the clock-signal and the feedback-data-signal in order to determine the timing-delay-signal.

8. The data-processing-circuit of claim 7, wherein:
   the feedback-buffer comprises a programmable feedback-buffer configured to apply a variable voltage-threshold-level; and
   the data-processing-circuit further comprises a controller configured to set the variable-voltage-threshold-level.

9. The data-processing-circuit of claim 1, wherein the time-alignment-module comprises:
   a plurality of time-delay-blocks, wherein:
      each time-delay-block provides an output signal that is a time-delayed version of its input signal;
      the input terminal of the first time-delay-block receives a signal that is representative of a transition in the data-output-signal;
      the input terminal of each of the further time-delay-blocks is connected to the output terminal of an immediately preceding time-delay-block; and
      the output terminals of the time-delay-blocks provide the timing-delay-signal.

10. The data-processing-circuit of claim 9,
wherein the plurality of time-delay-blocks are included as part of a feedback loop that is configured to adapt a delay-parameter of one or more of the plurality of time-delay-blocks, such that they have a fixed relation to the clock period of the clock-signal.

11. The data-processing-circuit of claim 10,
wherein the feedback loop is implemented as a delay-locked loop, and includes a DLL-controller,
wherein the DLL-controller is configured to process: the output signal from the last time-delay-block, the clock-signal, and the data-output-signal, in order to adapt the delay-parameter of the of one or more of the plurality of time-delay-blocks.

12. The data-processing-circuit of claim 1,
wherein the time-alignment-module is configured to:
   selectively provide the driver-strength-value based on a state of an enable-signal, which is representative of whether or not the driver-strength-value is to be updated.

13. The data-processing-circuit of claim 1,
wherein the time-alignment-module further comprises an output-multiplexer, the output-multiplexer having: a first-MUX-input-terminal; a second-MUX-input-terminal; and a MUX-output-terminal, wherein:
the driver-strength-value is configured to be provided to the first-MUX-input-terminal;
a fixed-driver-strength-value is provided to a second-MUX-input-terminal; and
the MUX-output-terminal is configured to apply either: the driver-strength-value; or the fixed-driver-strength-value to the adjustable-driver-buffer based on the state of an enable-signal, wherein the enable-signal is representative of whether or not the driver-strength-value is to be updated based on the timing-delay-signal.

14. The data-processing-circuit of claim 1,
wherein the target-delay-signal is representative of a target time delay between: a transition in the clock-signal; and a transition in the data-output-signal.

15. The data-processing-circuit of claim 1,
wherein the data-processing-circuit is a MIPI-data-processing-circuit.

16. A data-processing-circuit comprising:
a clock-input-terminal configured to receive a clock-signal;
a data-output-terminal configured to provide a data-output-signal;
an adjustable-driver-buffer configured to:
  receive a data-signal; and
  apply a driver-strength-value to the data-signal in order to provide a data-output-signal,
    wherein a current level of the data-output-signal is based on the driver-strength-value; and
a driver-control-module comprising:
  a time-alignment-module configured to:
  process the clock-signal and the data-output-signal in order to determine a timing-delay-signal that is representative of a time delay between: a transition in the clock-signal; and a transition in the data-output-signal; and
  provide the driver-strength-value for the adjustable-driver-buffer based on the timing-delay-signal and a target-delay-signal,
    wherein the driver-strength-value is for reducing a difference between: the timing-delay-signal; and the target-delay-signal;
wherein the time-alignment-module is configured to determine the driver-strength-value as a minimal value that results in the difference between the timing-delay-signal; and the target-delay-signal, being less than a difference-threshold-value.

17. A data-processing-circuit comprising:
a clock-input-terminal configured to receive a clock-signal;
a data-output-terminal configured to provide a data-output-signal;
an adjustable-driver-buffer configured to:
  receive a data-signal; and
  apply a driver-strength-value to the data-signal in order to provide a data-output-signal,
    wherein a current level of the data-output-signal is based on the driver-strength-value; and
a driver-control-module comprising:
  a time-alignment-module configured to:
  process the clock-signal and the data-output-signal in order to determine a timing-delay-signal that is representative of a time delay between: a transition in the clock-signal; and a transition in the data-output-signal; and
  provide the driver-strength-value for the adjustable-driver-buffer based on the timing-delay-signal and a target-delay-signal,
    wherein the driver-strength-value is for reducing a difference between: the timing-delay-signal; and the target-delay-signal;
wherein the driver-control-module further comprises, a feedback-buffer that is configured to apply a voltage-threshold-level to the data-output-signal in order to provide a feedback-data-signal that is representative of transitions in the data-output-signal; and
wherein the time-alignment-module is configured to process the clock-signal and the feedback-data-signal in order to determine the timing-delay-signal.

* * * * *